United States Patent
Saito

(10) Patent No.: US 6,335,256 B1
(45) Date of Patent: Jan. 1, 2002

(54) METHOD OF MANUFACTURING A BIPOLAR TRANSISTOR

(75) Inventor: Naoto Saito, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/516,985

(22) Filed: Mar. 1, 2000

(30) Foreign Application Priority Data

Mar. 19, 1999 (JP) .................................................. 11-075990

(51) Int. Cl.$^7$ .................................................. H01L 21/331
(52) U.S. Cl. ......................... 438/370; 438/357; 438/416
(58) Field of Search .................................. 438/309, 356, 438/357, 358, 414, 416, 372, 373, 375, 376, 377, 370, 419

(56) References Cited

U.S. PATENT DOCUMENTS 5,556,796 A * 9/1996 Garnett et al.
5,716,887 A * 2/1998 Kim ............................. 438/309
5,837,553 A * 11/1998 Pearce
5,895,249 A * 4/1999 Zambrano et al. ........... 438/356

* cited by examiner

Primary Examiner—Tuan H. Nguyen
(74) Attorney, Agent, or Firm—Adam & Wilks

(57) ABSTRACT

There is provided a bipolar transistor integrated circuit device having excellent characteristics by a simple process. A region where an impurity is not introduced is disposed in a part of a buried layer region for separating a collector region from a substrate, so that a bipolar transistor having low collector resistance can be formed. This can be applied also to a BiCMOS where insulated field effect transistors exist on the same substrate. These processes can be realized without adding a number of steps to a conventional process.

6 Claims, 4 Drawing Sheets

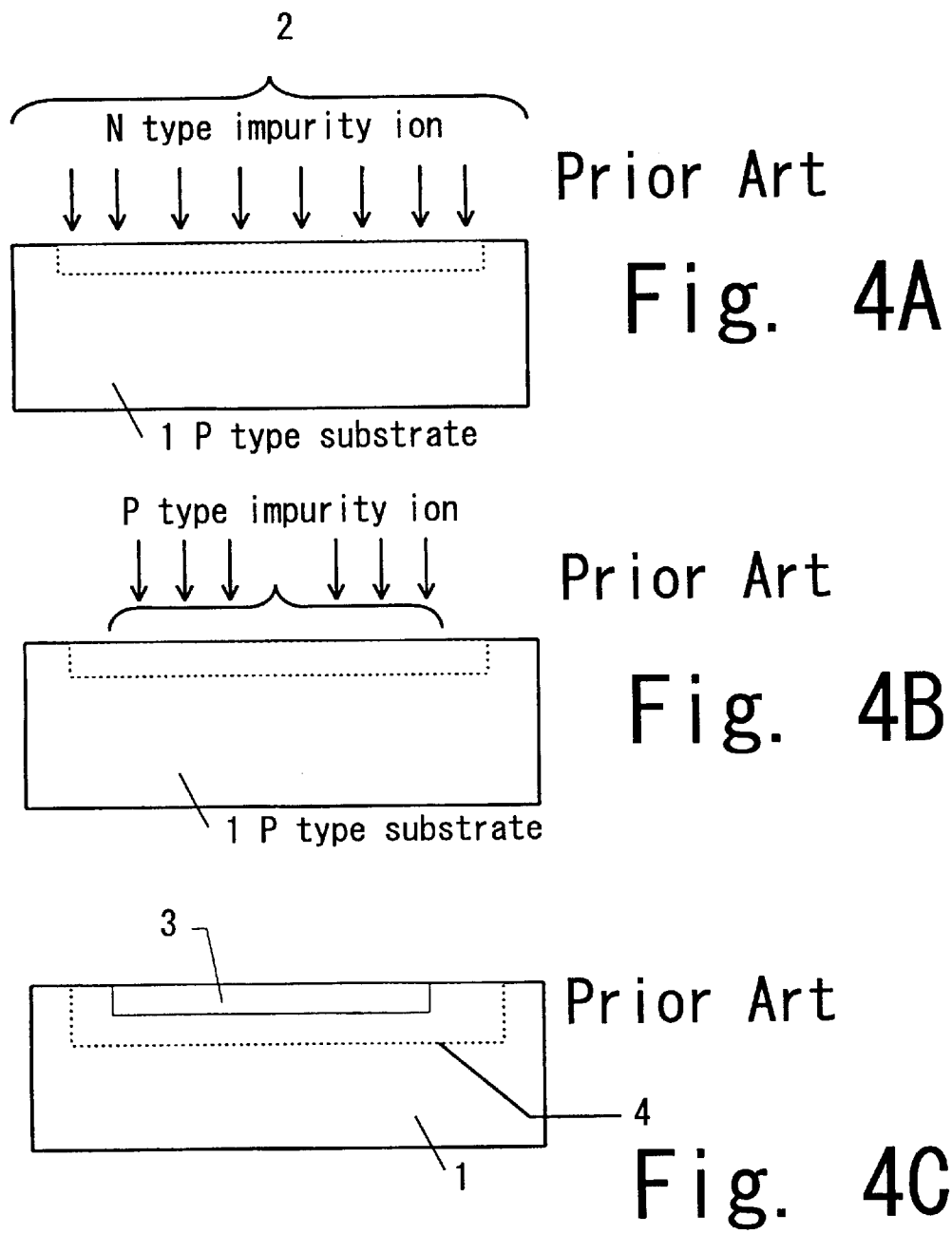

METHOD OF MANUFACTURING A BIPOLAR TRANSISTOR

BACKGROUND OF THE INVENTION

1. Field of the Invention

The present invention relates to a method of manufacturing a bipolar semiconductor device and a semiconductor integrated circuit device in which bipolar type and MIS type semiconductor devices are formed on the same substrate, and relates to a semiconductor integrated circuit device including a power supply semiconductor integrated circuit device having a constant voltage output function or constant current output function.

2. Description of the Related Art

Conventionally, in the whole region or part of a semiconductor substrate using an epitaxial growth film, a buried layer is provided under the epitaxial growth film. The buried layer is used for lowering the on resistance of a device formed over the buried layer and for improving a soft error and latch-up resistance. When NPN and PNP vertical bipolar transistors are formed on the same semiconductor substrate, for the purpose of electrically isolating a PNP type collector region from a substrate region, there is a case where an N-type buried layer region is additionally formed between the collector region and the substrate region. By doing so, the collector of the vertical PNP bipolar transistor can have an arbitrary potential.

Here, as a step of forming the N-type region for isolation, there are two methods, one of which is to use, as shown in FIGS. 4A to 4C, a step of introducing an N-type impurity having a high concentration, originally carried out for forming a collector region of the NPN bipolar transistor, and the other of which is to add a step of forming an N-type region having a relatively low concentration in addition to the former step.

However, when the N-type buried layer region formed to electrically isolate the PNP type collector region from the substrate region is used also as the NPN type collector region as shown in FIGS. 4A to 4C, since this N-type region has a high concentration, it is difficult to raise the concentration of a P-type region 3 formed on this region in a subsequent step. That is, the resistance of the PNP type collector region becomes high. If the concentration of the N-type region is made low, the resistance of the NPN type collector region becomes high reversely. On the other hand, when the N-type region is formed through the additional step, the number of masks and process steps is increased.

SUMMARY OF THE INVENTION

The present invention has been made in view of the above, and an object of the invention is to provide a method of manufacturing a semiconductor device, which enables a bipolar transistor with higher performance than the prior art, without an increase in the cost, and with high additional value to be formed.

BRIEF DESCRIPTION OF THE DRAWINGS

In the accompanying drawings:

FIGS. 4A to 4C are sectional views showing a conventional method of manufacturing a bipolar transistor.

DESCRIPTION OF THE PREFERRED EMBODIMENTS

Figure 1A:
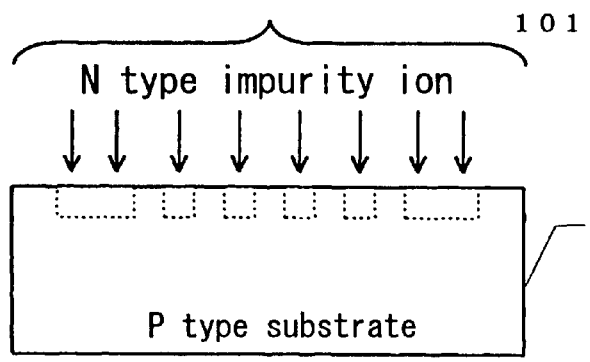
FIGS. 1A to 1D are sectional views showing a method of manufacturing a bipolar transistor according to an embodiment of the invention.

Embodiments of the present invention will be described below with reference to the drawings. In the drawings, for simplicity, the thicknesses of various layers are exaggeratingly shown.

Figure 1B:
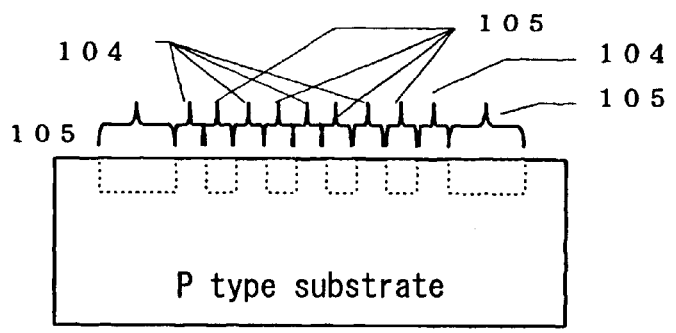
Figure 1C:
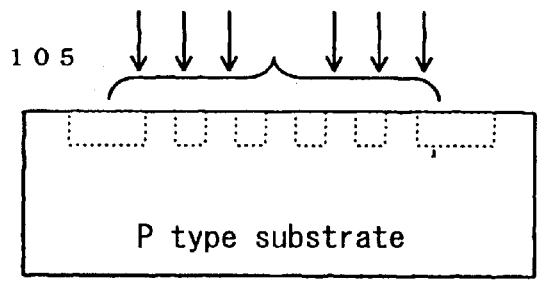
Figure 1D:
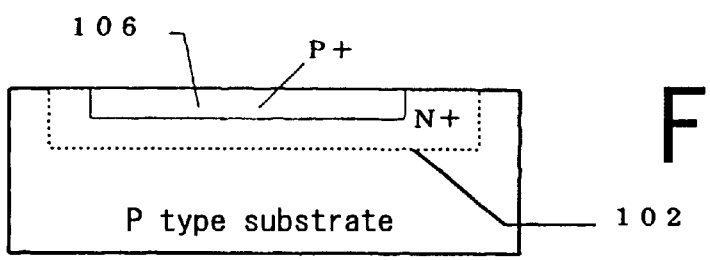
Figure 2A:
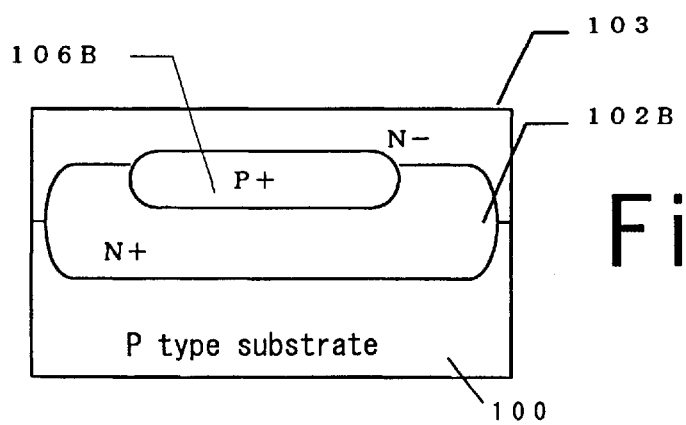
FIGS. 2A to 2B are sectional views showing steps subsequent to the steps shown in FIGS. 1A to 1D.
Figure 2B:
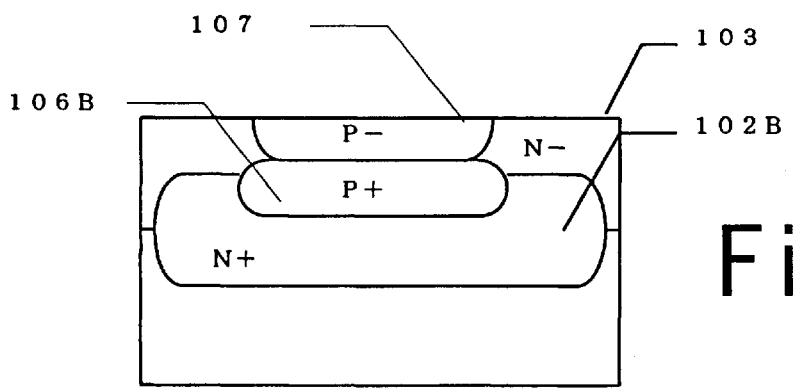
Figure 3:
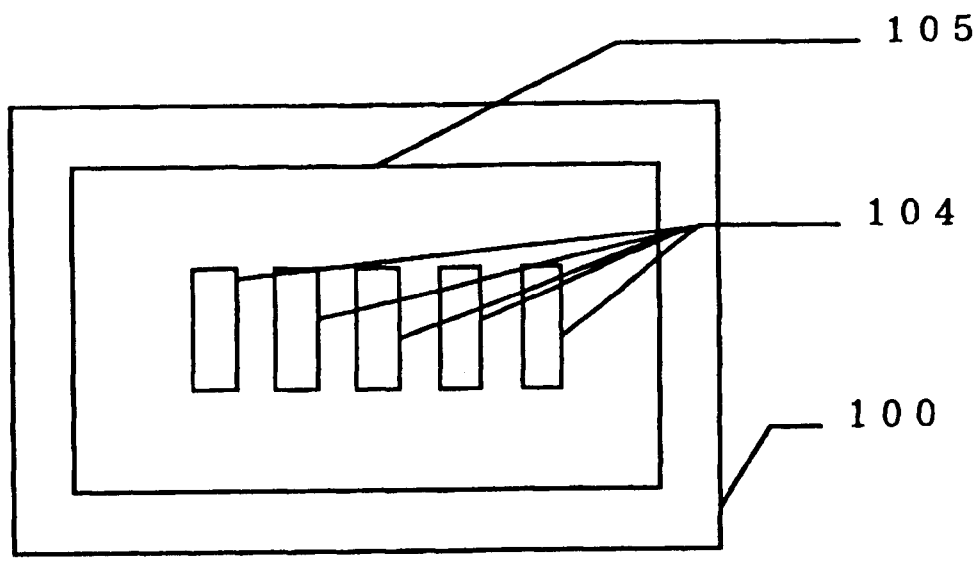
FIG. 3 is a plan view showing a step of a method of manufacturing a bipolar transistor according to an embodiment of the invention.

FIGS. 1A to 1D and 2A to 2B are schematic sectional views of sequential steps showing an embodiment of a semiconductor device according to a manufacturing method of the invention, and FIG. 3 is a plan view showing an embodiment of a semiconductor device according to a manufacturing method of the invention.

As shown in FIG. 1A, to a silicon semiconductor substrate 100, for example, a silicon semiconductor substrate having a P-type conductivity type and a resistivity of 20 to 30 $\Omega \cdot cm$, an N-type conductivity type impurity, for example, arsenic is introduced into a specific region of a region 101 where a bipolar transistor is formed in a subsequent step (not shown), to have a concentration of $1 \times 10^{16}$ atoms/$cm^3$ to $1 \times 10^{21}$ atoms/$cm^3$. At this time, a region 104 where the impurity is not introduced is provided in a part of a region 105 where the impurity is introduced, and the region 105 where the impurity is introduced is formed so as to surround the region 104 where the impurity is not introduced. In other words, a window where the impurity is not introduced is opened in the inside of the impurity introduced region. One or plural regions are provided as the region 104 where the impurity is not introduced. For example, in the case where plural regions are provided, the regions are formed as shown in FIG. 1B and FIG. 3. In FIG. 3, although the region 104 where the impurity is not introduced is rectangular, it may be circular. The region 104 where the impurity is not introduced is disposed at a position from a region just under an emitter region of a bipolar transistor formed in a subsequent step (not shown) to a region just under a collector electrode region.

For the purpose of electrically isolating a collector of a device formed in an epitaxial growth film 103 from the substrate and improving a soft error and latch-up resistance, the introduction amount of the impurity is made preferably $1 \times 10^{19}$ atms/$cm^3$ to $5 \times 10^{20}$ atms/$cm^3$, more preferably $1 \times 10^{21}$ atms/$cm^3$. Thereafter, as shown in FIG. 1C, for example, boron is doped in the inside of the region where arsenic was introduced. For example, the dose amount of boron is $1 \times 10^{14}$ to $3 \times 10^{14}$ atms/$cm^2$.

Thereafter, the doped impurity is diffused into the silicon semiconductor substrate 100 by an annealing step. At this point of time, as shown in FIG. 1D, the N-type impurity region 105 is diffused to the region 104 where the impurity was not introduced, so that such a shape is made that a p-type impurity region 106 is completely surrounded in the N-type impurity region 105. Thereafter, as shown in FIG. 2A, on the silicon semiconductor substrate 100, the epitaxial growth film 103, for example, an N-type conductivity type CVD epitaxial growth film using $SiH_2Cl_2$ and $PH_3$ as a gas source is formed to have a resistivity of 2 $\Omega \cdot cm$ and a film thickness of 8 $\mu m$. Further, as shown in FIG. 2B, a P-type impurity, for example, boron is introduced into the N-type epitaxial region on the region where boron was introduced, and is thermally diffused to be connected with the P-type region 106 introduced prior to the epitaxial growth, so that a collector region of a PNP bipolar transistor is formed. Eventually, since the region 104 where the N-type impurity was not introduced is provided in advance, the P-type impurity concentration becomes hard to cancel, so that the P-type impurity region 106B can be made a layer with a low resistance.

From the above, the PNP bipolar transistor having low collector resistance and high performance can be formed without increasing the number of masks and steps. By suitably changing the area and shape of the region 104 where an impurity is not introduced, an interval between the regions 104 where the impurity is not introduced, and a layout position while sufficiently taking collector resistance and parasitic bipolar effects into consideration, a transistor having desired characteristics can be easily formed.

As described above, the invention has effects that a bipolar transistor having excellent electric characteristics and a BiCMOS integrated circuit device can be formed without adding a number of complicated processes.

What is claimed is:

1. A method of manufacturing a bipolar transistor comprising a step of forming a part of a bipolar transistor on a substrate layer made of a first conductivity type semiconductor material, the method comprising:

a step of doping a specific region on an upper surface of the semiconductor substrate layer with a second conductivity type impurity;

a step of doping a specific region on an upper surface of the region, which was doped with the second conductivity type impurity, with a first conductivity type impurity;

a step of diffusing the second conductivity type impurity doped in the semiconductor substrate layer and the first conductivity type impurity doped in the specific region on the upper surface of the second conductivity type impurity region into the semiconductor substrate; and a step of forming a second conductivity type epitaxial layer on the upper surface of the semiconductor substrate layer, wherein with respect to the specific region on the first conductivity type semiconductor substrate layer, which is doped with the second conductivity type impurity, a region not doped with the second conductivity type impurity is provided inside of the specific region doped with the second conductivity type impurity, and the specific region doped with the second conductivity type impurity is formed to surround the region not doped with the second conductivity type impurity.

2. A method of manufacturing a semiconductor device according to claim 1, wherein the second conductivity type impurity is introduced into the specific region on the first conductivity type semiconductor substrate layer so that at least two regions which are not doped with the second conductivity type impurity exist in the specific region doped with the second conductivity type impurity.

3. A method of manufacturing a semiconductor device according to claim 1, wherein the second conductivity type impurity is introduced into the specific region on the first conductivity type semiconductor substrate layer so that at least two regions which are not doped with the second conductivity type impurity are arranged in parallel with each other and at an equal interval.

4. A method of manufacturing a semiconductor device according to claim 1, wherein the second conductivity type impurity is introduced into the specific region on the first conductivity type semiconductor substrate layer so that at least two regions which are not doped with the second conductivity type impurity are arranged in parallel with each other and at an equal interval in an X-axis direction and a Y-axis direction.

5. A method of manufacturing a semiconductor device according to claim 1, wherein the region not doped with the second conductivity type impurity in the specific region doped with the second conductivity type impurity is located at a place from an emitter region of the bipolar transistor to a region vertically below a collector surface electrode.

6. A method of manufacturing a semiconductor device according to claim 1, wherein a dose amount of the second conductivity type impurity is $1 \times 10^{15}$ atoms/cm$^2$ or more.

* * * * *